United States Patent [19]

Bhattacharyya et al.

[11] Patent Number: 5,666,004
[45] Date of Patent: Sep. 9, 1997

[54] USE OF TANTALUM OXIDE CAPACITOR ON CERAMIC CO-FIRED TECHNOLOGY

[75] Inventors: Bidyut K. Bhattacharyya; Larry Mosley, both of Chandler, Ariz.

[73] Assignee: Intel Corporation, Santa Clara, Calif.

[21] Appl. No.: 757,480

[22] Filed: Nov. 27, 1996

Related U.S. Application Data

[63] Continuation of Ser. No. 561,170, Nov. 21, 1995, abandoned, which is a continuation of Ser. No. 315,125, Sep. 28, 1994, abandoned.

[51] Int. Cl.$^6$ ................................................ H01L 23/34
[52] U.S. Cl. ........................ 257/724; 257/700; 257/730
[58] Field of Search ............................. 257/698, 532, 257/724, 700, 535, 680, 701, 723, 730, 924; 361/763

[56] References Cited

U.S. PATENT DOCUMENTS

| | | | |
|---|---|---|---|
| 4,458,295 | 7/1984 | Durschlag et al. | 257/532 |
| 5,008,734 | 4/1991 | Dutta et al. | 257/700 |
| 5,177,670 | 1/1993 | Shinohara et al. | 257/700 |

FOREIGN PATENT DOCUMENTS

| | | | |
|---|---|---|---|
| 55-86144 | 6/1980 | Japan | 257/924 |
| 63-293962 | 11/1988 | Japan | 257/698 |
| 2-294041 | 12/1990 | Japan | 257/532 |
| 3-136352 | 6/1991 | Japan | 257/724 |
| 4-298071 | 10/1992 | Japan | 257/532 |
| 6-132469 | 5/1994 | Japan | 257/924 |

OTHER PUBLICATIONS

Bell, S.A., et al. "Hybrid Tantalum Chip Capacitors," International Microelectric Symposium, 1972 pp. 4A11-4A16.

*Primary Examiner*—Jerome Jackson
*Assistant Examiner*—John Guay
*Attorney, Agent, or Firm*—Blakley, Sokoloff, Taylor & Zafman

[57] ABSTRACT

An electronic package which contains a tantalum oxide capacitor that couples a conductive bottom surface of an integrated circuit to a plurality of conductive lines within the housing of the package. The conductive lines are connected to pins which provide power and ground to the integrated circuit. The pins and conductive lines are also coupled to a number of junctions located on the top surface of the die, by a plurality of wires. The package couples both the top and bottom surfaces of the integrated circuit to the power and ground pins of the package.

3 Claims, 2 Drawing Sheets

USE OF TANTALUM OXIDE CAPACITOR ON CERAMIC CO-FIRED TECHNOLOGY

This is a Continuation Application of application Ser. No. 08/561,170, filed Nov. 21,1995, which in turn is a continuation of application Ser. No. 08/315,125, filed Sep. 28,1994. Both now abandoned.

BACKGROUND OF THE INVENTION

1. Field of the Invention

The present invention relates to an integrated circuit package.

2. Description of Related Art

It is generally desirable to produce integrated circuits (ICs) which require less power and operate at higher speeds than existing devices. The operation of low power/high speed integrated circuits can be effected by the electrical noise associated with the power supplied to the device. It is well known that the inductive noise of an IC can be reduced by connecting decoupling capacitors to the circuit.

U.S. application Ser. No. 07/837,285 filed by Mallick et al., and assigned to the same assignee as the present application, discloses an integrated circuit package which has a number of decoupling capacitors formed on a circuit board located within the package. The circuit board and capacitors are coupled to the semiconductive die by a plurality of parallel wires. The parallelism of the wires increases the inductance of the signals and reduces the effectiveness of the decoupling capacitors. It would therefore be desirable to directly mount the decoupling capacitors to the surface of the die to reduce the line length between the two devices and reduce the overall impedance of the package.

To effectively decouple an integrated circuit such as a microprocessor, the capacitors must have a capacitance value between 10 and 200 nanoFaurads (nF) and an inductance of approximately 1 picoHenry (pH). A single conventional capacitor typically has an inductance value of approximately 500 pH. Therefore to create a decoupling capacitance circuit having a net inductance of 1 pH would require the assembly and wiring of 10 discrete capacitors. Assembling multiple discrete elements is time consuming and generally increases the overall cost of producing the IC package. It would therefore be desirable to provide a low inductance decoupling capacitor module which can be efficiently mass produced and easily assembled to the surface of a semiconductive device.

SUMMARY OF THE INVENTION

The present invention is an electronic package which contains a tantalum oxide capacitor that couples a conductive bottom surface of an integrated circuit to a plurality of conductive lines within the housing of the package. The conductive lines are connected to pins which provide power and ground to the integrated circuit. The pins and conductive lines are also coupled to a number of junctions located on the top surface of the die by a plurality of wires. The present invention therefore provides a package that supplies power and ground to both the top and bottom surfaces of the integrated circuit.

The tantalum oxide capacitor has a higher capacitance and lower inductance than conventional capacitor in the art, and therefore provides an alternate current path other than the relatively high inductive path of the wire bonds. Together with the dual current paths to the integrated circuit, the use of a tantalum oxide capacitor significantly reduces the impedance of the package and the noise within the integrated circuit.

It is therefore an object of the present invention to provide an integrated circuit package which has a lower impedance than packages in the prior art.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
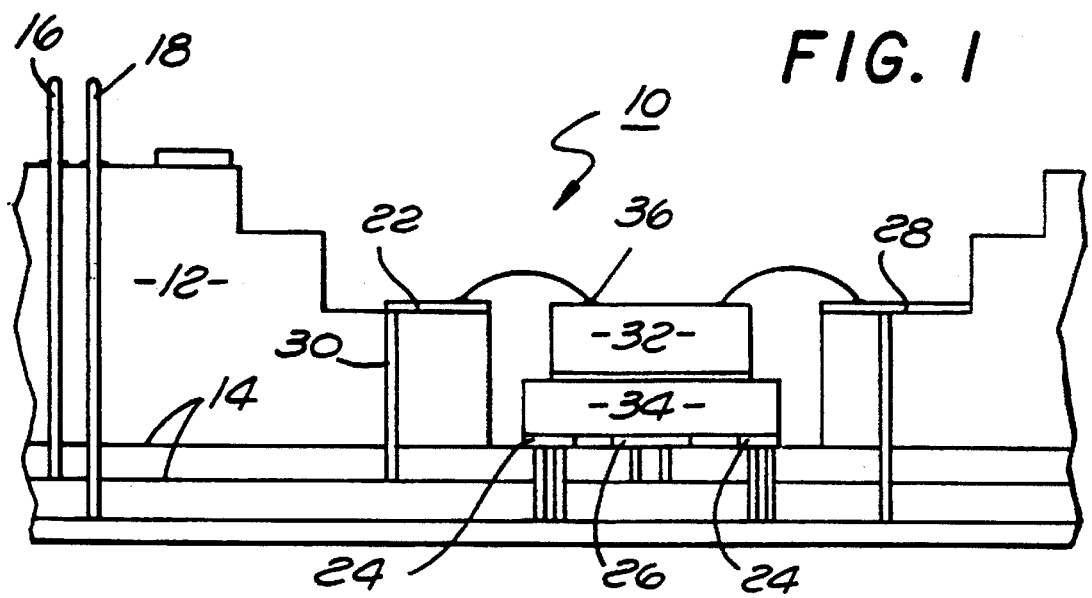
FIG. 1 is a cross-sectional view of an electronic package of the present invention.

Referring to the drawings more particularly by reference numbers, FIG. 1 shows an electronic package 10 of the present invention. The electronic package 10 includes a housing 12 which is typically constructed from a dielectric ceramic material co-fired into the configuration shown. Within the dielectric material are a plurality of conductive lines or planes 14. The planes 14 are connected to corresponding pins 16 and 18 which extend from an outer surface 20 of the housing 12. The housing 12 also has a plurality of conductive surface pads 22–28. The surface pads 22–28 are coupled to the planes 14 by conductive vias 30.

Within the housing 12 is a semiconductive die 32. The die 32 is typically an integrated circuit such as a microprocessor. The die 32 is attached to a capacitor 34 that is mounted to the housing 12. A plurality of wires 36 couple the conductive surface pads 22 and 28 of the housing 12 to corresponding pads on the top surface 36 of the die 32. The attachment of the wires 36 can be done by conventional wire bonding or tape automated bonding (TAB) techniques. The bond wire length is preferably within 0.040 inches and has an inductance of approximately 1.2 nanoHenry (nH). The die 32 is typically enclosed by a lid (not shown) that is attached to a lid seal area 38 of the housing 12. The electronic package is typically mounted to a printed circuit board (not shown) by soldering the pins 16 and 18 to plated through holes in the circuit board. As an alternate embodiment, in lieu of the pins, the housing may have external conductive surface pads that are surface mounted to a printed circuit.

Figure 2:
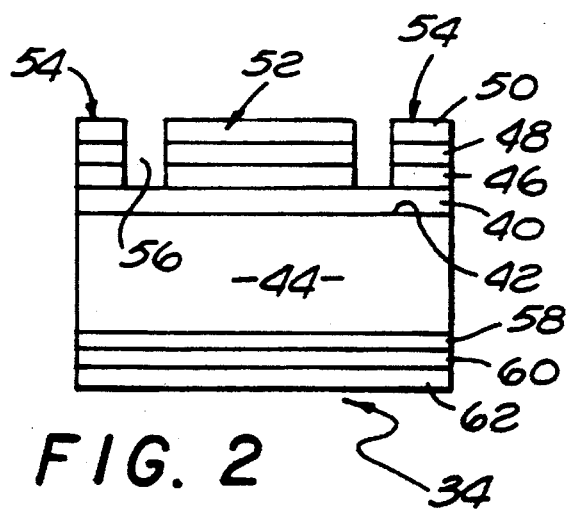
FIG. 2 is a cross-sectional view of a capacitor of the electronic package.

FIG. 2 shows a preferred embodiment of the capacitor 34. The capacitor 34 is constructed by initially growing a thin layer of tantalum oxide $Ta_2O_5$ 40 on the surface 42 of a tantalum substrate 44. The oxide layer 40 is preferably 2500–5000 angstroms (Å) thick. The substrate is typically 0.008–0.016 inches thick. The above described tantalum substrate and oxide layer create a capacitor which has capacitance values of between 350–700 picofarads per square millimeter (pf/mm2) and an inductance of approximately 1 pH.

Figure 3:
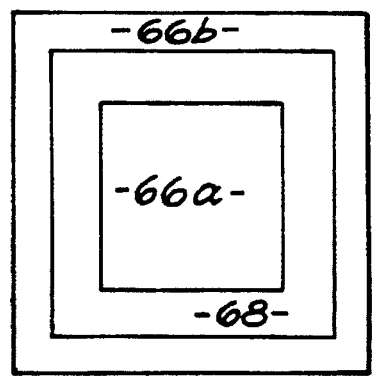
FIG. 3 is a top view of the cavity of the housing of the package before the capacitor is assembled thereto.

After the oxide layer 40 is formed, a layer of chromium 46 is sputtered onto the capacitor 34. Layers of nickel 48 and gold 50 are then plated on top of the chromium 46. A mask (not shown) is used to form a first electrode 52 and a pair of second electrodes 54 in the capacitor 34. The electrodes 52 and 54 are typically separated by a space 56 between 0.010 and 0.020 inches wide. Corresponding layers of chromium 58, nickel 60 and gold 62 are also formed on the opposite surface 64 of the capacitor 34. Referring to FIG. 1, the electrodes 52 and 54 are connected to the conductive surface pads 24 and 26 of the housing 12. The capacitor 34 can be coupled to the housing 12 by either gold tin eutectic preforms or conductive epoxy to provide an interconnect between the electrodes and the conductive pads. FIG. 3 provides a top view of the housing showing the solder preforms 66a–b formed as two concentric squares. The inner square 66a is coupled to the first electrode 52, the outer square 66b is coupled to the second electrodes 54. The preforms 66 are typically applied as a paste and are separated by an area 68 of no metalization.

Figure 4:
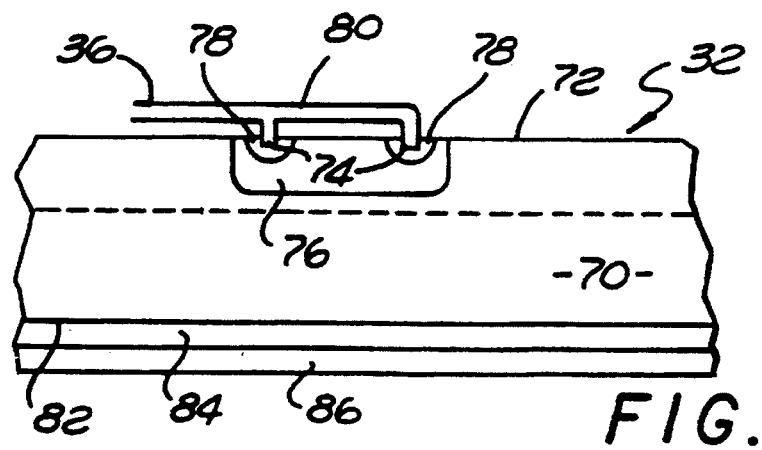
FIG. 4 is a cross-sectional view of a semiconductive die of the electronic package.

FIG. 4 shows a semiconductive die 32 which is typically constructed from a silicon substrate 70. Located on one surface 72 of the substrate 70 are a plurality of junctions 74 that are coupled to the wires 36. Each junction 74 is formed by initially doping an area of the substrate with a p– diffusion 76. The p– area 76 is typically 2–5 microns in depth. P+ ion implants 78 are then made within the p– area 76. The P+ ion implants 78 are connected to areas of aluminum metalization 80 which are coupled to the wires 36. The opposite surface 82 of the die 32 is plated with layers of nickel 84 and gold 86. The gold layer 86 of the die 32 is connected to the outer gold layer 62 of the capacitor 34 either with gold tin eutectic preforms or conductive epoxy.

Referring to FIG. 1, the capacitor 34 creates an alternate path for the current supplied to the die 32 from the pins 16 and 18. Power is typically supplied to pin 16, wherein current flows into the die 32 through surface pads 22 and wires 36, and through the capacitor 34 and across the silicon substrate 70. Additionally the current returns through the capacitor 34 and surface pads 28, and out of the package 10 through pin 18.

Figure 5:
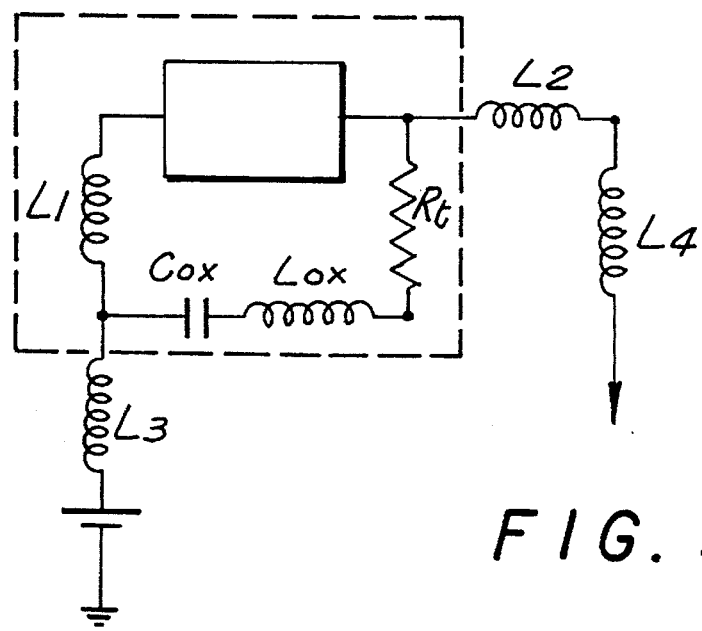
FIG. 5. is a schematic showing a representative circuit of the package of FIG.6.
Figure 6:
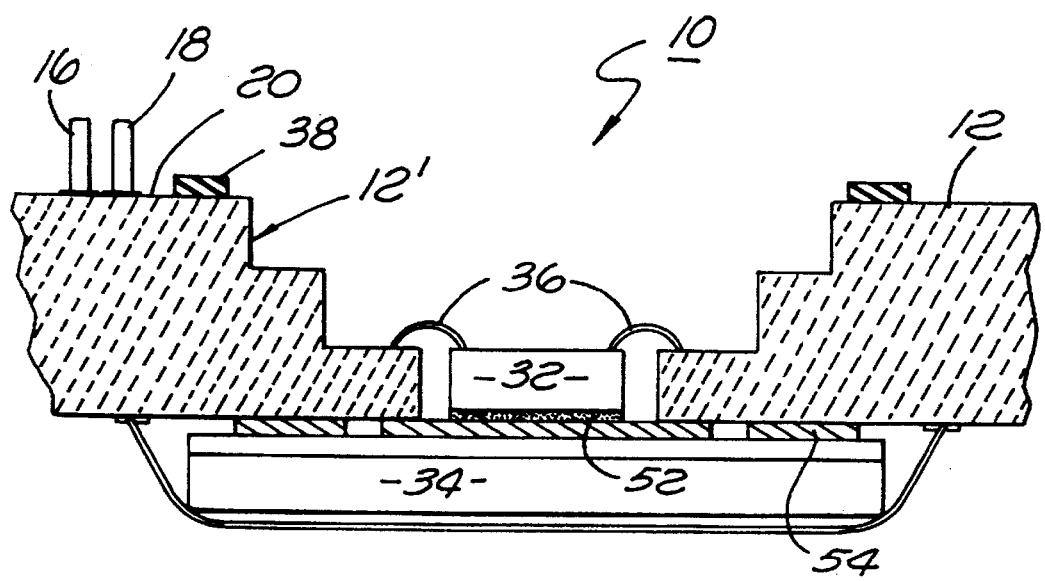
FIG. 6 is an alternate embodiment of the electronic package, wherein the capacitor also functions as a heat sink.

FIG. 5 shows a representative circuit of the package shown in FIG. 6. The resistance Rt is the effective resistance of the p diffusion of the silicon substrate. L1 and L2 are the inductance of the power and ground wires 36 of the package. The capacitance Cox and the inductance Lox are the capacitance and the inductance of the capacitor 34. In the preferred embodiment the resistance Rt is approximately 0.005 Ohms, Lox is 0.2 pH and L1 and L2 are each approximately 2 nH. Such an arrangement provides a package which has a relatively low overall impedance. It has been determined that the die can receive a current of 50 Amps per nanosecond (A/ns) and still maintain a noise margin of approximately 0.4 Volts.

FIG. 6 shows an alternate embodiment of the electronic package 10. In this configuration, only the first electrode 52 of the capacitor 34 is attached to the die 32 and the pins 16 and 18 of the housing 12'. The second electrodes 54 are coupled to the housing 12' to provide an additional thermal path between the die and the housing 12'. The capacitor 34 preferably extends from the housing 12 and provides a large amount of surface area which increases the overall thermal performance of the package. If a p type semiconductive device is used in the package, then a plastic cover 88 is placed around the capacitor 34 to prevent an electrical shocks. In this embodiment the capacitor is being used to control both electrical noise and reduce the junction temperature of the device. The package is particularly useful for high power applications. It has been determined that the package 10" is effective for power usage greater than 50 Watts.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a package that has a first outer surface and an opposite second outer surface, said package further containing a surface pad located on a bonding shelf and a center opening;

a capacitor that is mounted to said first outer surface of said package;

an integrated circuit that is mounted and electrically connected to said capacitor through said center opening of said package; and, a bond wire that couples said integrated circuit to said surface pad.

2. The package as recited in claim 1, wherein said ceramic package has a pin that extends from said second outer surface and is electrically coupled to said surface pad.

3. The package as recited in claim 1, wherein said capacitor has a first electrode connected to said integrated circuit and a second electrode connected to said package.

* * * * *